(12) United States Patent
Busekrus

(10) Patent No.: US 11,921,532 B2
(45) Date of Patent: Mar. 5, 2024

(54) CONTROLLING PULSED OPERATION OF A POWER SUPPLY DURING A POWER OUTAGE

(71) Applicant: Landis+Gyr Innovations, Inc., Alpharetta, GA (US)

(72) Inventor: Doug Busekrus, Lafayette, IN (US)

(73) Assignee: Landis+Gyr Technology, Inc., Alpharetta, GA (US)

(*) Notice: Subject to any disclaimer, the term of this patent is extended or adjusted under 35 U.S.C. 154(b) by 245 days.

(21) Appl. No.: 17/506,528

(22) Filed: Oct. 20, 2021

(65) Prior Publication Data
US 2023/0120207 A1 Apr. 20, 2023

(51) Int. Cl.
*G05F 1/575* (2006.01)
*G01R 22/06* (2006.01)
*H03K 5/24* (2006.01)

(52) U.S. Cl.
CPC ........... *G05F 1/575* (2013.01); *G01R 22/061* (2013.01); *H03K 5/24* (2013.01)

(58) Field of Classification Search
CPC ............ G01R 19/165; G01R 19/16533; G01R 19/16538; G01R 19/16547; G01R 22/06; G01R 22/061; G05F 1/575; H03K 5/22; H03K 5/24
See application file for complete search history.

(56) References Cited

U.S. PATENT DOCUMENTS

| 6,665,620 | B1 | 12/2003 | Burns et al. | |
|---|---|---|---|---|
| 2008/0258709 | A1* | 10/2008 | Shuey | G01R 19/16547 324/110 |
| 2009/0167547 | A1* | 7/2009 | Gilbert | G01R 19/16547 340/662 |
| 2014/0002169 | A1 | 1/2014 | Ramirez | |
| 2014/0028463 | A1* | 1/2014 | Chamarti | G01D 4/002 340/870.02 |
| 2014/0100809 | A1* | 4/2014 | Fahrenbruch | G01R 35/04 702/85 |
| 2015/0138838 | A1* | 5/2015 | Block | H02M 1/44 363/16 |
| 2017/0005646 | A1* | 1/2017 | Hargreaves | G06F 3/00 |
| 2019/0089157 | A1* | 3/2019 | Kobayashi | H02J 3/10 |
| 2019/0383866 | A1* | 12/2019 | Stenberg | G01R 22/068 |

\* cited by examiner

*Primary Examiner* — Huy Q Phan
*Assistant Examiner* — David B Frederiksen
(74) *Attorney, Agent, or Firm* — Kilpatrick Townsend & Stockton LLP

(57) ABSTRACT

A power supply control circuit for controlling operation of a power supply for an electricity meter during an alternating current (AC) power outage includes: an input section configured to receive a representation of an output voltage of the power supply and a power loss signal; a comparator section configured to generate an output signal based on the power loss signal and the representation of the output voltage; and a feedback control section configured to control a feedback signal to the power supply based on the output signal from the comparator section. When activated by the output signal from the comparator section, the feedback control section is configured to change the feedback signal with respect to the feedback signal from a feedback circuit caused the output voltage. The change in the feedback signal causes the power supply to stop supplying the output voltage.

22 Claims, 5 Drawing Sheets

CONTROLLING PULSED OPERATION OF A POWER SUPPLY DURING A POWER OUTAGE

BACKGROUND

Unless otherwise indicated herein, the materials described in this section are not prior art to the claims in this application and are not admitted to be prior art by inclusion in this section.

An electricity meter measures electrical power consumed by a customer of an electric utility provider. The electricity meter is plugged into a meter socket that is mounted in an enclosure on a building or other structure, and draws its operating power from the electrical power distribution grid. Electricity meters record electric energy consumption and communicate the information as well as status information of the meter itself to the utility provider for monitoring and billing. When power outages occur, an electricity meter no longer has the ability to communicate with the utility provider.

In order to operate a radio to enable the electricity meter to provide a "last gasp" communication to the utility provider when a power outage occurs, electricity meters may rely on energy stored in storage capacitors to maintain operation of communication circuitry for a limited period of time. The stored energy needs to be sufficient to operate the electricity meter power supply to maintain radio operation. The capacitors needed to store sufficient energy to operate the radio for a long enough period of time can be large and expensive. Efficient power supply operation can maximize the time the radio can be operated on the limited energy available from the storage capacitors.

SUMMARY

Systems and methods for operation of an offline switching power supply for an electricity meter during a power outage may be provided.

According to various aspects there is provided a power supply control circuit for controlling operation of a power supply for an electricity meter during an alternating current (AC) power outage. In some aspects, the power supply control circuit may include: an input section configured to receive a representation of an output voltage of the power supply and a power loss signal; a comparator section configured to generate an output signal based on the power loss signal and the representation of the output voltage; and a feedback control section configured to control a feedback signal to the power supply based on the output signal from the comparator section. When activated by the output signal from the comparator section, the feedback control section may be configured to change the feedback signal with respect to the feedback signal generated by a feedback circuit based on the output voltage. The change in the feedback signal may cause the power supply to stop supplying the output voltage.

According to various aspects there is provided an electricity meter. In some aspects, the electricity meter may include: a power supply; and a power supply control circuit for controlling operation of the power supply for an electricity meter during an alternating current (AC) power outage. The power supply control circuit may include: an input section configured to receive a representation of an output voltage of the power supply and a power loss signal; a comparator section configured to generate an output signal based on the power loss signal and the representation of the output voltage; and a feedback control section configured to control a feedback signal to the power supply based on the output signal from the comparator section. When activated by the output signal from the comparator section, the feedback control configured to change the feedback signal with respect to the feedback signal generated by a feedback circuit based on the output voltage. The change in the feedback signal may cause the power supply to stop supplying the output voltage.

According to various aspects there is provided a method for controlling operation of a power supply for an electricity meter during an alternating current (AC) power outage. In some aspects, the method may include: receiving, by a power supply control circuit, an AC power loss signal; generating, by the power supply control circuit, a false feedback signal to the power supply, wherein the false feedback signal is different than a feedback signal generated by an output voltage of the power supply, wherein the false feedback signal causes the power supply to stop supplying the output voltage; determining that the output voltage of the power supply reached a lower voltage threshold; and in response to determining that the output voltage of the power supply reached the lower voltage threshold, ceasing generation of the false feedback signal.

BRIEF DESCRIPTION OF THE DRAWINGS

Aspects and features of the various embodiments will be more apparent by describing examples with reference to the accompanying drawings, in which.

DETAILED DESCRIPTION

While certain embodiments are described, these embodiments are presented by way of example only, and are not intended to limit the scope of protection. The apparatuses, methods, and systems described herein may be embodied in a variety of other forms. Furthermore, various omissions, substitutions, and changes in the form of the example methods and systems described herein may be made without departing from the scope of protection.

An electricity meter measures electrical power consumed by a customer of an electric utility provider. The electric electricity is plugged in to a meter socket that is mounted in an enclosure on a building or other structure and provides a connection between the electric power delivered by the electrical utility and the customer. The electricity meter measures and controls the electricity delivered to the customer premises via the grid. The electricity meter may be combined with a communications module to enable the meter to communicate with other meters and with the utility. The electricity meter may be part of a utility management system.

Figure 1:
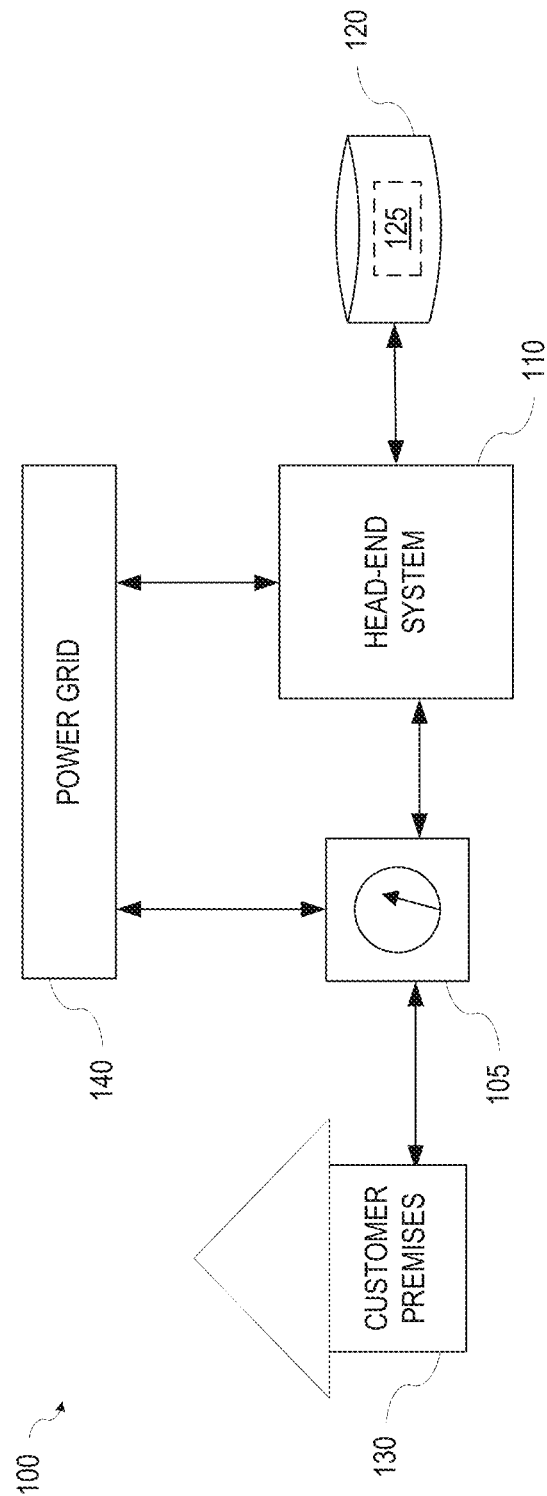
FIG. 1 is diagram illustrating an example of a utility management system according to some aspects of the present disclosure.

FIG. 1 is a diagram illustrating an example of a utility management system 100 according to various aspects of the present disclosure. Referring to FIG. 1, the utility management system 100 may include an electricity meter 105, a head-end system 110, and a storage device 120. While FIG. 1 illustrates one electricity meter 105 for ease of explanation, one of ordinary skill in the art will appreciate that a plurality of electricity meters 105 may be included in the disclosed utility management system 100 without departing from the scope of the present disclosure.

The electricity meter 105 may monitor and/or record the energy usage at the customer premises 130 and communicate the information about energy usage to the head-end system 110. For example, the electricity meter 105 may continually monitor and record total energy usage at the customer premises 130. In accordance with various aspects of the present disclosure, the electricity meter 105 may monitor and/or record days of the week and times of the day related to energy usage at the customer premises 130 and communicate the information to the head-end system 110. In addition, the electricity meter 105 may perform as a sensor to detect and/or record abnormal measurements and/or events, for example, but not limited to, power outages. One of ordinary skill in the art will appreciate that other information, for example, but not limited to, average power consumed, peak power, etc., may be monitored and communicated by the electricity meter 105.

The electricity meter 105 may communicate with the head-end system 110 via wired or wireless communication interfaces known to those of skill in the art using communication protocols appropriate to the specific communication interface. Different wired or wireless communication interfaces and associated communication protocols may be implemented on the electricity meter 105 for communication with the head-end system 110. For example, in some embodiments a wired communication interface may be implemented, while in other embodiments a wireless communication interface may be implemented for communication between the electricity meter 105 and the head-end system 110. In some embodiments, a wireless mesh network may connect a plurality of electricity meters 105. The plurality of electricity meters 105 may transmit data to a collector (not shown) that communicates with another network to transmit the data to the head-end system 110. The electricity meters 105 may use radio frequency (RF), cellular, or power line communication to communicate. One of ordinary skill in the art will appreciate that other communication methods may be used without departing from the scope of the present disclosure.

The head-end system 110 may include a storage device 120. The storage device 120 may be, for example, but not limited to, one or more hard-disk drives, solid-state memory devices, or other computer-readable storage media. One of ordinary skill in the art will appreciate that other storage configurations may be used without departing from the scope of the present disclosure. A database 125 may be stored on the storage device 120. The database 125 may store information collected from the electric meters 105. For example, the database 125 may include days of the week and times of the day correlating with load is operating information, for example, but not limited to, average power consumed by the load, peak power consumed by the load, etc. One of ordinary skill in the art will appreciate that this information is exemplary and that other information may be included in the database 125 without departing from the scope of the present disclosure.

The head-end system 110 and the electricity meter 105 may be connected to an electrical power distribution grid 140. The electrical power distribution grid 140 may include generating stations (not shown) that produce electric power (not shown), electrical substations (not shown) for stepping electrical voltage up for transmission or stepping electrical voltage down for distribution, high voltage transmission lines (not shown), and distribution lines (not shown).

Figure 2:
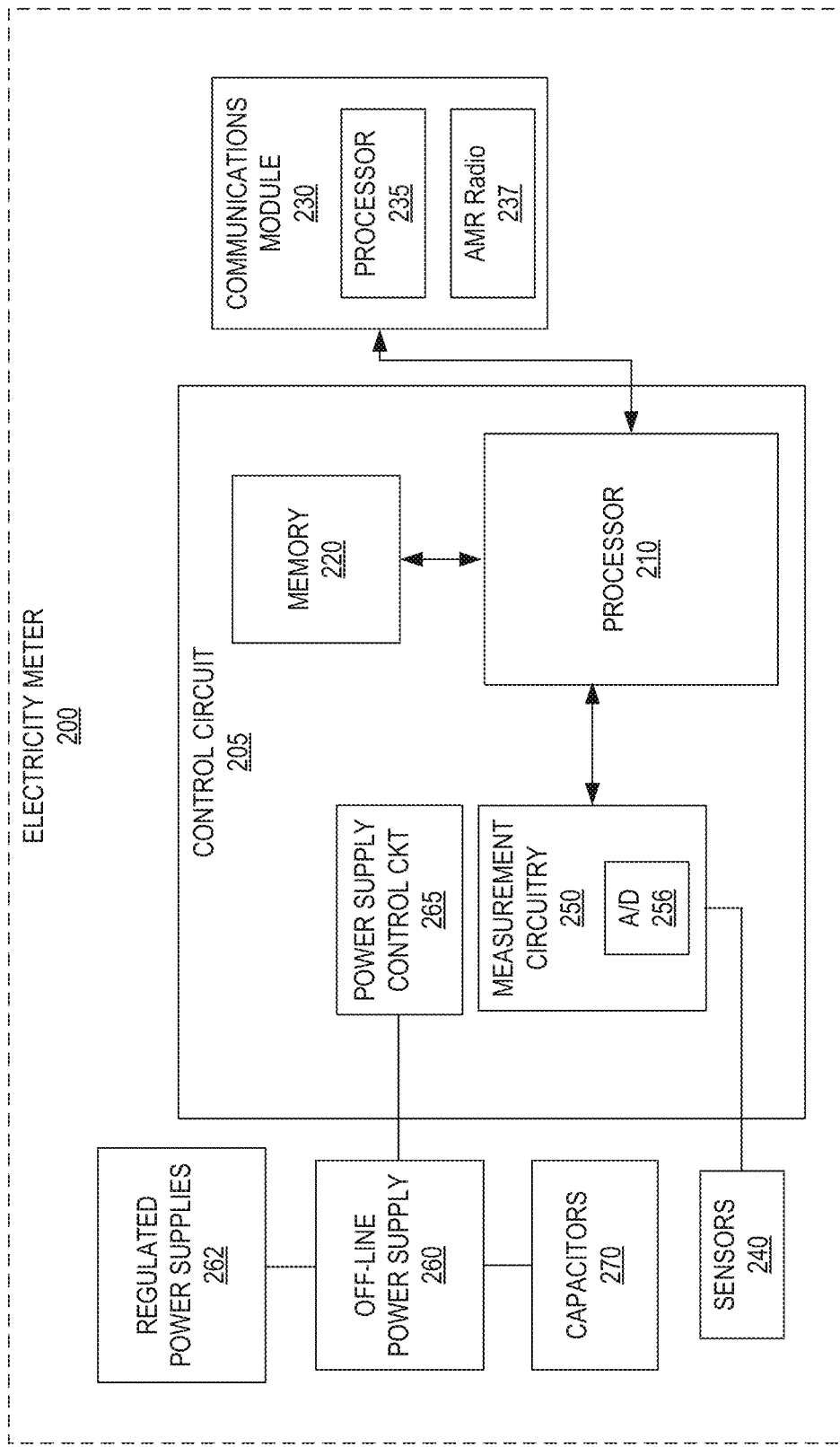
FIG. 2 is a simplified block diagram illustrating an example of an electric meter according to various aspects of the present disclosure.

FIG. 2 is a simplified block diagram illustrating an example of an electricity meter 200 according to some aspects of the present disclosure. The electricity meter 200 may be, for example, the electricity meter 105 of FIG. 1. The electricity meter 200 may also be referred to as a smart meter or a smart electricity meter. The electricity meter 200 may include a control circuit 205, a memory 220, a communications module 230, various sensors 240, a power supply 260, and one or more storage capacitors 270.

The control circuit 205 may include a processor 210, a memory 220, measurement circuitry 250, and a power supply control circuit 265. The processor 210 may be a general purpose processor, a digital signal processor (DSP), an application specific integrated circuit (ASIC), a field programmable gate array (FPGA) or other programmable logic device. The processor 210 may be in electrical communication with the memory 220, the communications module 230, and the sensors 240. The processor 210 may control overall operation of the electricity meter 200. The processor 210 may receive data generated by various sensors 240 of the electricity meter 200 including, but not limited to, energy use, voltage, current, etc., and may perform operations on, or processing of, the data. The processor 210 may communicate with the communications module 230 to transmit various operational parameters (e.g., energy usage), diagnostic data (e.g., error conditions), or other electric meter information (e.g., GPS coordinates) to a head-end system and/or to other electric meters via a wired or wireless network.

The memory 220 may be a storage device such as a solid state storage device or other storage device, and may be a combination of volatile and non-volatile storage or memory. In some implementations, portions of the memory may be included in the processor 210. The memory 220 may be configured to store instructions executable by the processor 210, as well as data generated by the various sensors 240 of the electricity meter 200, and other applications executable by the processor 210.

The communications module 230 may be a wired or wireless transceiver operable to communicate via various wired or wireless protocols as known in the field for example, but not limited to, the AMI protocol, RF protocols, cellular protocols, PLC network protocols, etc. The communications module 230 may include a processor 235 configured to control operation of the communications module 230. In some implementations, the communications module 230 may include AMI devices and/or AMR devices, including an AMI radio and/or an AMR radio 237. The AMI radio and/or AMR radio 237 may transmit data to and receive data from the head-end system using radio frequency (RF) technologies or power line communication (PLC). The communications module 230 may enable the electricity meter 200 to communicate with other electricity meters in a network (e.g., an AMI network) and with the utility provider (e.g., a head-end system). The communications module 230 may transmit data and alarm signals to the utility provider and receive any of updated program instructions, firmware updates, updates to other settings, or other communications.

The sensors 240 may include, but are not limited to, voltage sensors, current sensors, accelerometers, tilt switches, temperature sensors, and other sensors configured to monitor electrical and physical characteristics of the electricity meter 200.

The measurement circuitry 250 may interface with the sensors 240. The measurement circuitry 250 may include an analog-to-digital (A/D) converter 256 configured to receive analog signals from the sensors 240 and convert the analog signals to digital values that may be operated on by the processor 210.

The power supply 260 may be a direct current (DC) power supply and may receive a primary DC voltage generated by rectifying a primary alternating current (AC) voltage from the grid to which the electricity meter 200 is connected. The power supply 260 may also be referred to herein as an offline switching power supply or an offline power supply. In some implementations, power supply 260 may receive and rectify the primary AC voltage. The power supply 260 may generate a lower secondary voltage DC from the primary DC voltage. The secondary DC voltage generated by the power supply 260 may supply DC power to other components of the electricity meter 200.

The power supply control circuit 265 may control the amount of time the power supply 260 can operate at its operational switching frequency during a loss of primary AC voltage from the grid. The power supply control circuit 265 may receive an AC power loss signal and may cause the power supply 260 to operate only after the secondary DC voltage decreases to a specified lower threshold value and may cause the power supply 260 to cease operation when the secondary DC voltage increases to a specified upper voltage threshold. The power supply control circuit 265 may cause the on-off duty cycle of the power supply 260 to continue as the secondary DC voltage reaches the lower and upper threshold values until the energy stored in the primary holdup capacitors 270 is depleted.

The electricity meter 200 may further include one or more regulated power supplies 262. The regulated power supplies 262 may receive the secondary DC voltage output from the power supply 260 and may regulate the secondary DC voltage to lower DC voltages for operating other circuitry of the electricity meter 200, for example, but not limited to, the AMI radio and/or AMR radio 237.

The storage capacitors 270 may provide primary power to the electricity meter 200 for a short period of time immediately after a power outage. The storage capacitors 270 may be electric double layer capacitors (EDLC), also referred to as an ultracapacitors or supercapacitors, or another type of capacitor. The storage capacitors 270 may store sufficient energy to operate the power supply 260 for a limited period of time to enable the electricity meter 200 to transmit a "last gasp" message to the head-end system. The last gasp message may include a notification of the power outage as well as other information (e.g., energy usage, error conditions, or other electric meter information) at the time power was lost.

While offline switching power supplies can alter their operation to increase their efficiency while supplying power to low loads, operation can still be lossy with low efficiencies (e.g., less than 50%). The default low load control mechanisms of offline switching power supplies maintain good regulation on the output, and therefore operate switching cycles at frequencies in the kHz range to maintain the regulation.

According to some aspects of the present disclosure, the operational time for the electricity meter to transmit a "last gasp" message may be extended by pulsed operation of the offline switching power supply. The pulsed operation may be achieved by overriding a feedback signal to the offline switching power supply, thereby extending the off time of the on-off periodic operation of the offline switching power supply for a longer than typical duration. When the offline switching power supply is turned back on, it may operate at near full load which is higher on the power supply efficiency curve.

While the extended off time can introduce a large ripple on the secondary voltage, the increased ripple can be acceptable for some applications such as providing power for the electricity meter during a power outage. The pulsed operation of the offline switcher can allow higher efficiency switching cycles to be used which translates into higher energy transfer from primary to secondary of the power supply. The higher energy transfer can result in longer holdup times for the secondary voltages of the electricity meter during a power outage. Under expected use case applications in an electricity meter, an approximately 7.5% increase in the holdup time may be provided.

Figure 3:
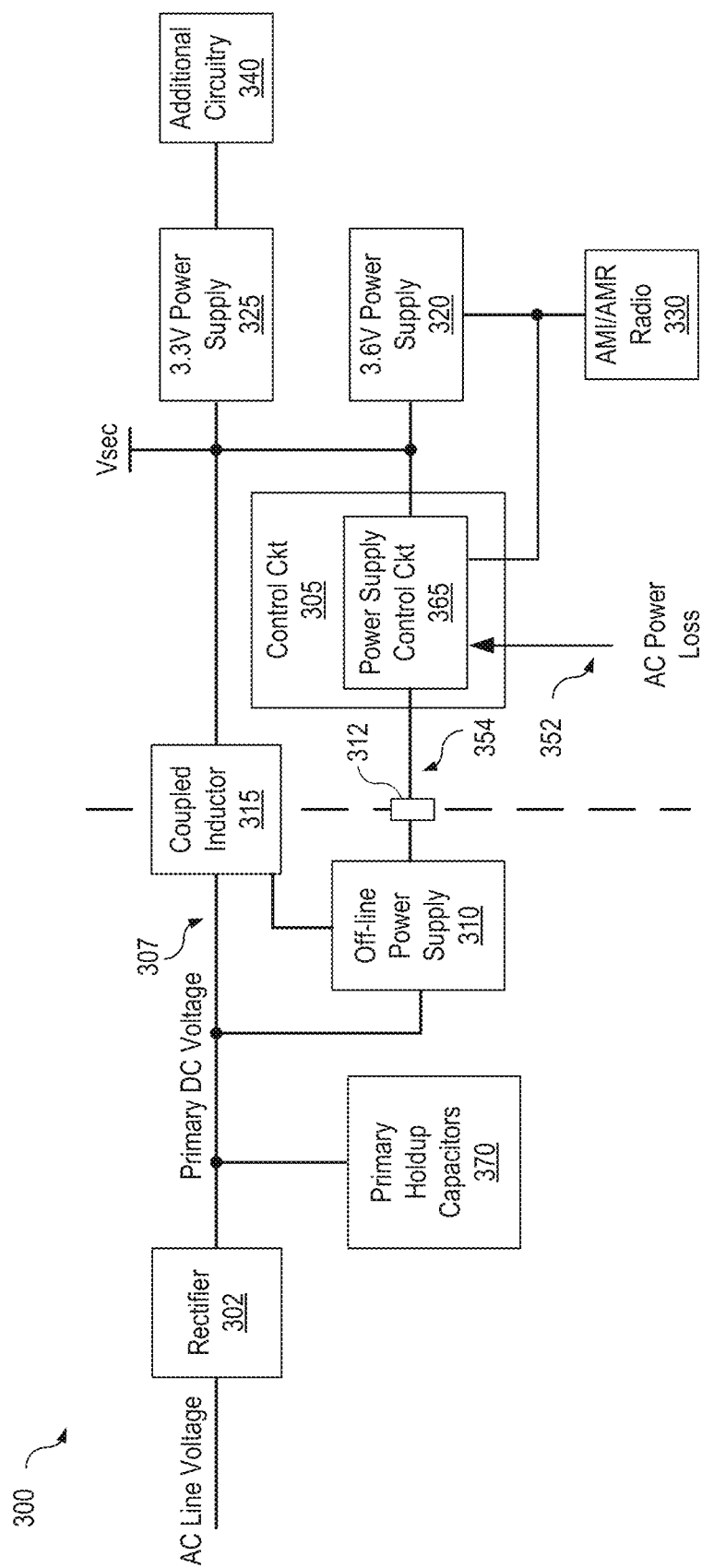
FIG. 3 is a simplified block diagram illustrating an example of an electric meter including a power supply control circuit according to some aspects of the present disclosure.

FIG. 3 is a simplified block diagram illustrating an example of an electric meter 300 including a power supply control circuit 365 according to some aspects of the present disclosure. Referring to FIG. 3, the electricity meter 300 may include an offline switching power supply 310, a first regulated power supply 320, a second regulated power supply 325, and control circuit 305. The control circuit 305 may be, for example, the control circuit 205 in FIG. 2. The power supply control circuit 365 may be part of the control circuit 305 or may be circuitry separate from the control circuit. The power supply control circuit 365 may be, for example, the power supply control circuit 265 in FIG. 2. The offline switching power supply 310 may operate with an input voltage from a primary DC voltage of the electricity meter 300. The primary DC voltage may be a generated from an AC line voltage rectified by a full wave rectifier 302. The primary DC voltage may be, for example, 350 volts DC (VDC) or another DC voltage. The offline switching power supply 310 may supply a secondary DC voltage Vsec to the first regulated power supply 320 and the second regulated power supply 325.

The offline switching power supply 310 may be a switching power supply, for example, but not limited to a buck-boost power supply or other power supply, operable to convert the primary DC voltage into a lower secondary DC voltage Vsec. The secondary DC voltage Vsec may be for example, 12 VDC or another DC voltage. The offline switching power supply 310 may convert the primary DC voltage to the secondary DC voltage Vsec by periodically transferring energy stored in the primary winding of the coupled inductor 315 to the secondary winding of the coupled inductor 315. Electrical isolation (e.g., galvanic isolation) between circuitry connected to the primary DC voltage and circuitry connected to the secondary DC voltage may be provided by the coupled inductor 315. In some implementations, the coupled inductor 315 may be a transformer. Isolated feedback of the secondary DC voltage Vsec may be provided to the offline switching power supply 310 via an isolation device 312, for example, but not limited to, an opto-coupler or other isolation device.

The first regulated power supply 320 may be a switching power supply or other power supply operable to convert the secondary DC voltage Vsec provided by the offline switching power supply 310 to a lower voltage, for example 3.6

VDC or another DC voltage. The first regulated power supply 320 may supply power for components of the electricity meter 300, for example, but not limited to, the AMI radio and/or AMR radio 330.

The second regulated power supply 325 may be a switching power supply or other power supply operable to convert the secondary DC voltage Vsec provided by the offline switching power supply 310 to a lower voltage, for example 3.3 VDC or another DC voltage. The second regulated power supply 325 may supply power for auxiliary circuitry and/or components that are not required to be operated during an AC power outage. The auxiliary circuitry 340 and/or components may be switched off during an AC power outage.

When an AC power outage occurs, the power supply control circuit 365 may receive an AC power loss signal 352 from AC power loss detection circuitry (not shown) indicating the loss of AC power. The power supply control circuit 365 may operate to provide a false feedback signal 354 to the offline switching power supply 310 via the isolation device 312. The false feedback signal 354 may provide an indication to the offline switching power supply 310 that the secondary DC voltage Vsec is higher than the actual secondary DC voltage Vsec. Providing a false feedback signal indicating that the secondary DC voltage Vsec is higher than the actual secondary DC voltage Vsec can cause the offline switching power supply 310 to remain in an off state (e.g., no switching) for longer periods of time.

When the secondary DC voltage Vsec reaches a specified lower threshold value, the power supply control circuit 365 may provide the actual feedback signal (e.g., the feedback signal generated by the actual secondary DC voltage Vsec) to the offline switching power supply 310. The lower threshold value may be a minimum voltage needed to operate specified components of the electric meter, for example, but not limited to, the AMI/AMR radio or other components. The actual feedback signal may provide an indication to the offline switching power supply 310 that the secondary DC voltage Vsec is below the regulation point, thereby causing the offline switching power supply 310 to begin operating at its full operational frequency duty cycle in an attempt to quickly reach its normal regulated secondary DC voltage Vsec output. In some implementations, the offline switching power supply may operate with a fixed duty cycle and variable switching frequency. In such implementations, the offline switching power supply may increase its switching frequency to attempt to reach its normal regulated secondary DC voltage Vsec output.

When the secondary DC voltage Vsec reaches a specified upper threshold value, the power supply control circuit 365 may again operate to provide a false feedback signal 354 to the offline switching power supply 310. The specified upper threshold value may be set lower than the normal regulated secondary DC voltage. The false feedback signal 354 may provide an indication that the secondary DC voltage Vsec is higher than the actual secondary DC voltage Vsec, thereby causing the offline switching power supply 310 to turn off (e.g., stop switching). The power supply control circuit 365 may cause the on-off duty cycle of the offline switching power supply 310 to continue as the secondary DC voltage reaches the lower and upper voltage thresholds until the energy stored in the primary holdup capacitors 370 is depleted.

Figure 4:
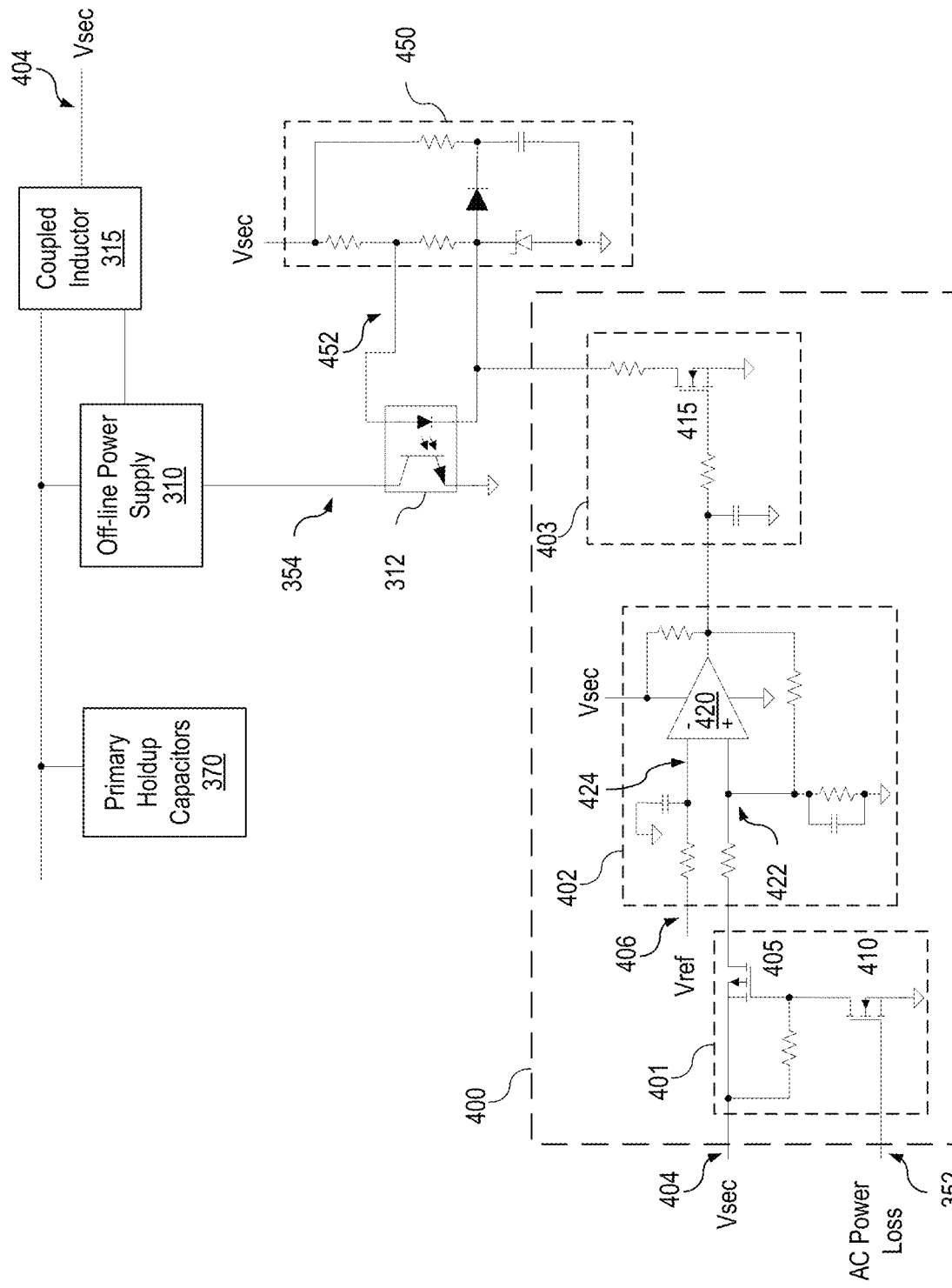
FIG. 4 is a simplified schematic diagram illustrating an example of a power supply control circuit according to some aspects of the present disclosure.

FIG. 4 is a simplified schematic diagram illustrating an example of a power supply control circuit 400 according to some aspect of the present disclosure. The power supply control circuit 400 may be, for example, the power supply control circuit 365 in FIG. 3. Referring to FIG. 4, the power supply control circuit 365 may include an input section 401, a comparator section 402, and a feedback control section 403.

The input section 401 may include components that function to monitor AC power loss 352 and the output voltage Vsec 404, and provide an input signal to the comparator section 402 For example, application of the output voltage Vsec 404 to the comparator section may be controlled by a first switching device 405 and a second switching device 410 may monitor for AC power loss 352. The switching devices may be, for example, transistors such as MOSFETS, bipolar transistors, or other transistor types. In some implementations, the functions of the input section 401 may be provided by analog circuitry such as operational amplifiers, or by a processor configured to monitor for AC power loss and control the output voltage, or via logic gates controlled by a processor.

The comparator section 402 may include a comparator 420 and feedback components. The comparator may be, for example, but not limited to, an operational amplifier, a processor, logic gates, etc. The feedback control section 403 may include a third switching device 415.

During normal operation of the electricity meter, a feedback circuit 450 senses the output voltage Vsec 404 and provides a sense signal 452 to the isolation device 312. The sense signal 452 causes the isolation device 312 to generate a feedback signal 354 to the offline switching power supply 310. The feedback signal 354 enables the offline switching power supply 310 to regulate the output voltage Vsec 404 to a specified voltage, for example, 12 VDC or another DC voltage.

The output voltage Vsec 404 of the offline switching power supply 310 may be applied to the first switching device 405. In some implementations, a representation of the output voltage Vsec 404 may be applied to the first switching device 405. For example, the representation may be a scaled output voltage of a voltage divider or other voltage dependent on the output voltage Vsec 404 may be applied to the first switching device 405. The first switching device 405 may be, for example, a p-channel MOSFET or another switching device. When a loss of AC power is detected, power loss detection circuitry (not shown) may generate an AC power loss signal 352 to the second switching device 410. The second switching device 410 may be, for example, an n-channel MOSFET or another switching device.

When the AC power loss signal 352 is received, the second switching device 410 may cause the first switching device 405 to provide the output voltage Vsec 404 of the offline switching power supply 310 or the representation of the output voltage Vsec 404 to a first input 422 (e.g., the positive input) of the comparator 420. A reference voltage 406 may be applied to a second input 424 (e.g., the negative input) of the comparator 420. The reference voltage 406 may be, for example, an operating voltage for a specified component, for example, the AMI/AMR radio 330, or other portion of circuitry of the electricity meter. The reference voltage 406 may be a voltage generated by regulating the output voltage Vsec 404 of the offline switching power supply 310 to a lower voltage, for example, 3.6 VDC or another voltage. In some implementations, a representation of the reference voltage 406 may be applied to the to a second input 424 of the comparator 420. For example, the representation may be a scaled output voltage of a voltage divider or other voltage dependent on the operating voltage for the specified component may be applied to the second input 424 of the comparator 420.

With the output voltage Vsec 404 or the representation of the output voltage Vsec 404 applied to the first input 422 of the comparator 420 just after the AC power loss signal 352 signal is received, the output signal of the comparator 420 may change the feedback signal. For example, the output signal of the comparator 420 may be in a high state, thereby causing the third switching device 415 to conduct current. The third switching device 415 may be, for example, an n-channel MOSFET or another switching device. The current conducted through the third switching device 415 is drawn through the isolation device 312, thereby causing the isolation device 312 to generate a higher feedback signal 354 (e.g., a false feedback signal) than generated from the sense signal 452 provided by the feedback circuit 450 based on the output voltage Vsec 404. The higher feedback signal 354 may cause the offline switching power supply 310 to remain in an off state (e.g., no switching) even though the actual output voltage Vsec 404 decreases below the specified regulation point for the output voltage Vsec 404. In some implementations, the operation of the comparator 420 may cause the feedback signal to decrease.

After a period of time, the output voltage Vsec 404 may decrease to a specified lower threshold value, for example, 4 VDC or another DC voltage, since the offline switching power supply 310 is in an off state. The lower threshold value may be higher than a minimum voltage needed to operate a specified component of the electric meter, for example, but not limited to the AMI/AMR radio or other component. When the output voltage Vsec 404 decreases to the specified lower threshold value, the output signal of the comparator 420 may change to a low state, thereby causing the third switching device 415 to cease conducting current. The sense signal 452 provided by the feedback circuit 450 may cause the isolation device 312 to generate a feedback signal 354 based on the actual output voltage Vsec 404. Since the actual output voltage Vsec 404 may be much lower (e.g., 4 VDC) than the specified regulation point for the output voltage Vsec 404, the feedback signal 354 may cause the offline switching power supply 310 to turn on at substantially its full operational switching frequency duty cycle to bring the output voltage Vsec 404 into regulation.

As the output voltage Vsec 404 increases toward the specified regulation point (e.g., 12 VDC) an upper threshold value may be reached. The upper threshold value may be lower than the specified regulation point, for example 10 VDC or another voltage. In some implementations, the upper threshold value may be may be a scaled representation of the specified regulation point. For example, the representation may be a scaled output voltage of a voltage divider or other voltage dependent on the specified regulation point. When the output voltage Vsec 404 reaches the upper threshold value, the output signal of the comparator 420 may again change from a low state to a high state, thereby causing the third switching device 415 to conduct current. The output signal of the comparator in the high state may be proportional to the output voltage Vsec 404 and may decrease along with the decreasing output voltage Vsec 404. The current conducted by the third switching device 415 may cause the isolation device 312 to generate the false (e.g., higher or lower) feedback signal 354 which may cause the offline switching power supply 310 to go to an off state (e.g., no switching) even though the output voltage Vsec 404 is below the specified regulation point.

The power supply control circuit 400 may cause the on-off duty cycle of the offline switching power supply 310 to continue as the output voltage Vsec 404 reaches the lower and upper thresholds until the energy stored in the primary holdup capacitors 370 is depleted. The upper and lower voltage thresholds that cause the comparator 420 to change state may be set by appropriate selection of feedback components in the comparator section 402 to provide hysteresis for the comparator 420 as known to those skilled in the art.

Figure 5:
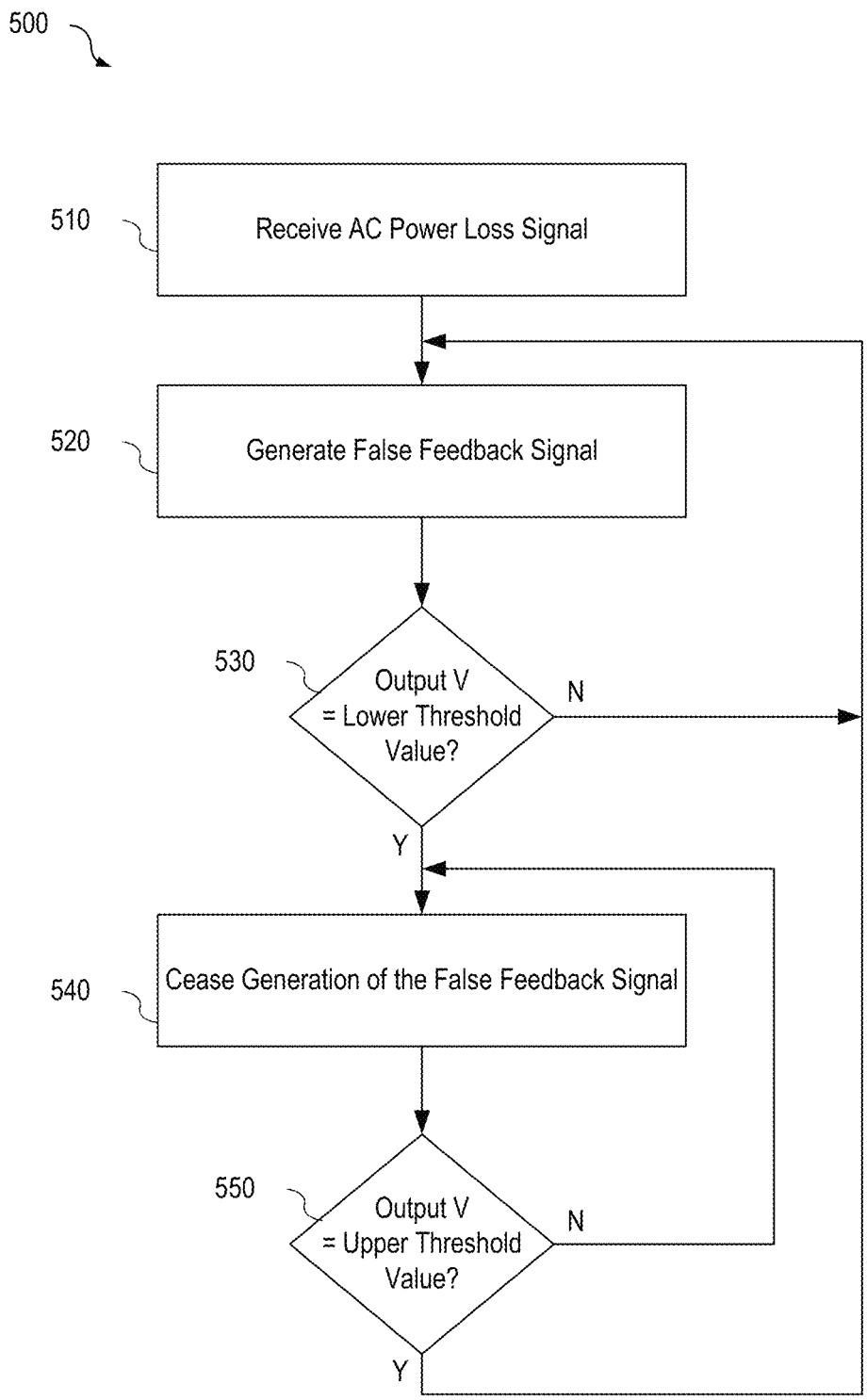
FIG. 5 is a flowchart illustrating an example of a method for operation of an offline switching power supply for an electricity meter during a power outage according to aspects of the present disclosure.

FIG. 5 is a flowchart illustrating an example of a method 500 for operation of an offline switching power supply for an electricity meter during a power outage according to aspects of the present disclosure. Referring to FIG. 5, at block 510, an AC power loss signal may be received. Duty cycle control circuitry, for example, the power supply control circuit 400, may receive an AC power loss signal from AC power loss detection circuitry indicating the loss of AC power to the electricity meter.

At block 520, a false feedback signal may be generated. When the AC power loss signal is received, the power supply control circuit may generate a false (e.g., higher or lower) feedback signal to the offline switching power supply (e.g., the offline switching power supply 310). The false feedback signal may provide an indication to the offline switching power supply that the output voltage of the offline switching power supply is higher than the actual output voltage. The false feedback signal can cause the offline switching power supply to remain in an off state (e.g., no switching) for longer periods of time.

At block 530, it may be determined whether the output voltage reached a lower threshold value. The lower threshold value may be a voltage higher than a minimum voltage needed to operate a specified component of the electric meter, for example, but not limited to the AMI/AMR radio or other component. In response to determining that the output voltage has not reached the lower threshold value (530-N), the false feedback signal may continue being generated at block 520.

In response to determining that the output voltage has reached the lower threshold value (530-Y), at block 540, the false feedback signal may cease being generated. The power supply control circuit may stop generating the false (e.g., higher or lower) feedback signal to the offline switching power supply, and the actual feedback signal may be generated by a feedback circuit of the electricity meter. The feedback circuit senses the output voltage and provides a sense signal to an isolation device that causes the isolation device to generate a feedback signal to the offline switching power supply based on the actual output voltage. The feedback signal enables the offline switching power supply to regulate the output voltage 404 to a specified voltage, for example, 12 VDC.

At block 550, it may be determined whether the output voltage reached to an upper threshold value. As the output voltage Vsec 404 increases toward the specified regulation point for the output voltage (e.g., 12 VDC) an upper threshold value may be reached. The upper threshold value may be lower than the specified regulation point, for example 10 VDC or another voltage. In some implementations, In some implementations, the upper threshold value may be may be a scaled representation of the specified regulation point. In response to determining that the output voltage is not greater than or equal to the upper threshold value (550-N), the actual feedback signal, rather than the false feedback signal, may continue to be generated at block 540.

In response to determining that the output voltage has not reached the upper threshold value (550-Y), the false feedback signal may again be generated at block 520. The power supply control circuit may cause the on-off duty cycle of the offline switching power supply to continue as the output voltage reaches the lower and upper voltage thresholds until the energy stored in the primary holdup capacitors is depleted.

The specific operations illustrated in FIG. 5 provide a particular method for operation of an offline switching power supply for an electricity meter during a power outage according to an embodiment of the present disclosure. Other sequences of operations may also be performed according to alternative embodiments. For example, alternative embodiments of the present disclosure may perform the operations outlined above in a different order. Moreover, the individual operations illustrated in FIG. 5 may include multiple sub-operations that may be performed in various sequences as appropriate to the individual operation. Furthermore, additional operations may be added or removed depending on the particular applications.

The method 500, may be embodied on a non-transitory computer readable medium, for example, but not limited to, the memory 220 or other non-transitory computer readable medium known to those of skill in the art, having stored therein a program including computer executable instructions for making a processor, computer, or other programmable device execute the operations of the methods.

The examples and embodiments described herein are for illustrative purposes only. Various modifications or changes in light thereof will be apparent to persons skilled in the art. These are to be included within the spirit and purview of this application, and the scope of the appended claims, which follow.

What is claimed is:

1. A power supply control circuit for controlling operation of a power supply for an electricity meter during an alternating current (AC) power outage, the power supply control circuit comprising:
an input section configured to receive a representation of an output voltage of the power supply and a power loss signal, wherein the input section comprises:
a first switching device configured to receive the representation of the output voltage of the power supply; and
a second switching device configured to receive the power loss signal,
wherein the second switching device is configured to activate the first switching device when the power loss signal is received, and
wherein the first switching device is configured to supply the representation of the output voltage to a comparator section when activated by the second switching device;
the comparator section configured to generate an output signal based on the power loss signal and the representation of the output voltage; and
a feedback control section configured to control a feedback signal to the power supply based on the output signal from the comparator section,
wherein when activated by the output signal from the comparator section, the feedback control section is configured to change the feedback signal with respect to the feedback signal generated by a feedback circuit based on the output voltage, and
wherein the change in the feedback signal causes the power supply to stop supplying the output voltage.

2. The power supply control circuit of claim 1, wherein the comparator section comprises:
a comparator configured to receive the representation of the output voltage at a first input and generate the output signal; and
feedback components configured to set an upper threshold value for the output voltage and a lower threshold value for the output voltage,
wherein the comparator is further configured to generate the output signal at a first value when the output voltage reaches the upper threshold value until the output voltage reaches the lower threshold value, and to generate the output signal at a second value when the output voltage reaches the lower threshold value.

3. The power supply control circuit of claim 2, wherein the comparator is further configured to receive a representation of a reference voltage at a second input, wherein the representation of the reference voltage is representative of a minimum voltage for operation of a component of the electricity meter.

4. The power supply control circuit of claim 2, wherein the feedback components are configured to set the lower threshold value to a value higher than a value representative of a minimum voltage for operation of a component of the electricity meter.

5. The power supply control circuit of claim 2, wherein the feedback components are configured to set the upper threshold value to a value lower than a representation of a regulation point of the power supply.

6. The power supply control circuit of claim 1, wherein the feedback control section comprises:
a third switching device configured to change the feedback signal by changing a current provided by the feedback circuit when activated by the output signal from the comparator section.

7. The power supply control circuit of claim 1, wherein when AC power is available, the feedback signal to the power supply is based only on a signal generated by the feedback circuit according to the output voltage.

8. An electricity meter comprising:
a power supply; and
a power supply control circuit for controlling operation of the power supply for the electricity meter during an alternating current (AC) power outage, the power supply control circuit comprising:
an input section configured to receive a representation of an output voltage of the power supply and a power loss signal, wherein the input section comprises:
a first switching device configured to receive the representation of the output voltage of the power supply; and
a second switching device configured to receive the power loss signal,
wherein the second switching device is configured to activate the first switching device when the power loss signal is received, and
wherein the first switching device is configured to supply the representation of the output voltage to a comparator section when activated by the second switching device;
the comparator section configured to generate an output signal based on the power loss signal and the representation of the output voltage; and
a feedback control section configured to control a feedback signal to the power supply based on the output signal from the comparator section,
wherein when activated by the output signal from the comparator section, the feedback control section is configured to change the feedback signal with respect to the feedback signal generated by a feedback circuit based on the output voltage, and wherein the change in the feedback signal causes the power supply to stop supplying the output voltage.

9. The electricity meter of claim 8, wherein the input section of the power supply control circuit comprises:
one or more components configured to receive the output voltage of the power supply and the power loss signal, and to supply the output voltage to the comparator section when the power loss signal is received.

10. The electricity meter of claim 8, wherein the comparator section of the power supply control circuit comprises:
a comparator configured to receive a voltage based on the output voltage at a first input and generate the output signal; and
feedback components configured to set an upper threshold value for the output voltage and a lower threshold value for the output voltage,
wherein the comparator is further configured to generate the output signal at a first value when the output voltage reaches the upper threshold value until the output voltage reaches the lower threshold value, and to generate the output signal at a second value when the output voltage reaches the lower threshold value.

11. The electricity meter of claim 10, wherein the comparator is further configured to receive a reference voltage at a second input, wherein the reference voltage is representative of a minimum voltage for operation of a component of the electricity meter.

12. The electricity meter of claim 10, wherein the feedback components are configured to set the lower threshold value to a value higher than a minimum voltage for operation of a component of the electricity meter.

13. The electricity meter of claim 10, wherein the feedback components are configured to set the upper threshold value to a value lower than a representation of a regulation point of the power supply.

14. The electricity meter of claim 8, wherein the feedback control section of the power supply control circuit comprises:
a third switching device configured to change the feedback signal by changing a current provided by the feedback circuit when activated by the output signal from the comparator section.

15. The electricity meter of claim 8, wherein the power supply is an offline switching power supply.

16. The electricity meter of claim 8, wherein when AC power is available, the feedback signal to the power supply is based only on a signal generated by the feedback circuit according to the output voltage.

17. A method for controlling operation of a power supply for an electricity meter during an alternating current (AC) power outage, the method comprising:
receiving, by a power supply control circuit, an AC power loss signal;
generating, by the power supply control circuit, a false feedback signal to the power supply, wherein the false feedback signal is different than a feedback signal generated by an output voltage of the power supply, wherein the false feedback signal causes the power supply to stop supplying the output voltage;
determining that the output voltage of the power supply reached a lower voltage threshold; and
in response to determining that the output voltage of the power supply reached the lower voltage threshold, ceasing generation of the false feedback signal.

18. The method of claim 17, further comprising setting the lower voltage threshold to a value higher than a minimum voltage for operation of a component of the electricity meter.

19. The method of claim 17, further comprising:
determining that the output voltage of the power supply reached an upper voltage threshold; and
in response to determining that the output voltage of the power supply reached the upper voltage threshold, generating, by the power supply control circuit, the false feedback signal.

20. The method of claim 19, further comprising setting the upper voltage threshold to a value lower than a representation of a regulation point of the power supply.

21. The method of claim 17, wherein generating the false feedback signal comprises changing a current for a feedback signal provided by a feedback circuit of the electricity meter.

22. The method of claim 17, wherein when AC power is available, the feedback signal to the power supply is based only on a signal generated by a feedback circuit of the electricity meter according to the output voltage.

* * * * *